United States Patent [19]

Kajiwara et al.

[11] Patent Number: 5,431,324
[45] Date of Patent: Jul. 11, 1995

[54] ULTRASONIC BONDING APPARATUS AND QUALITY MONITORING METHOD

[75] Inventors: Ryoichi Kajiwara, Hitachi; Mituo Katou, Hitachiota; Kazuya Takahashi, Katsuta; Minoru Maruta, Minamiashigara; Tokiyuki Seto, Odawara; Kunihiro Tsubosaki, Hino, all of Japan

[73] Assignee: Hitachi, Ltd., Tokyo, Japan

[21] Appl. No.: 8,578

[22] Filed: Jan. 22, 1993

[30] Foreign Application Priority Data

Jan. 24, 1992 [JP] Japan .................................. 4-010740

[51] Int. Cl.$^6$ .............................................. B23K 20/10
[52] U.S. Cl. .................................. 228/102; 228/103; 228/110.1; 228/1.1
[58] Field of Search ................. 228/102, 103, 1.1, 8, 228/110, 110.1

[56] References Cited

U.S. PATENT DOCUMENTS

| | | | |
|---|---|---|---|
| 3,153,850 | 10/1964 | Worlton et al. | 228/1.1 |
| 3,763,545 | 10/1973 | Spanjer | 228/102 |
| 4,834,111 | 5/1989 | Khanna et al. | 128/774 |
| 5,199,630 | 4/1993 | Felber et al. | 228/102 |

FOREIGN PATENT DOCUMENTS

| | | | |
|---|---|---|---|
| 55-72050 | 5/1980 | Japan | 228/1.1 |
| 55-120145 | 9/1980 | Japan | 228/8 |
| 61-22641 | 1/1986 | Japan | 228/1.1 |
| 62-293731 | 12/1987 | Japan | . |

Primary Examiner—P. Austin Bradley
Assistant Examiner—Jeffrey T. Knapp
Attorney, Agent, or Firm—Antonelli, Terry, Stout & Kraus

[57] ABSTRACT

An ultrasonic bonding apparatus comprises an ultrasonic wave controller, a bonding system including a bonding head, a laser oscillator, a laser optics, a vibration monitoring system including a vibrometer, and a mechanism for feeding a result of monitoring back to a bonding condition.

12 Claims, 5 Drawing Sheets

ULTRASONIC BONDING APPARATUS AND QUALITY MONITORING METHOD

BACKGROUND OF THE INVENTION

The present invention relates to apparatus for performing bonding by utilizing an ultrasonic wave and more particularly, to an ultrasonic bonding apparatus for micro-bonding usable as a technique of packaging semiconductor package, multi-chip module, liquid crystal device and thin film magnetic head and to a method for monitoring of quality of ultrasonic bonding used in the ultrasonic bonding apparatus.

The bonding method using heat and ultrasonic wave in combination available in the field of semiconductors is applied to automatic fabrication line in mass production and therefore in the method, control of bonding quality is particularly important.

Accordingly, many techniques have been proposed of which one takes advantage of an ultrasonic vibratory state of a bonding tool. For example, disclosed in JP-A-62-293731, when load on the bonding tool is constant, a detected level of ultrasonic wave corresponds to a friction factor between a wire and an electrode terminal; therefore, a bonding state of the wire can be detected on real time.

SUMMARY OF THE INVENTION

The technique disclosed in JP-A-62-293731, aiming at measuring air vibration, always measures a vibratory state of a portion in maximum vibration and fails to measure a vibration of a specified portion of the bonding tool. Accordingly, when a constraint condition on the tool changes as bonding proceeds and the portion vibrating at the maximum amplitude moves, a vibration of the tool tip portion having the most intimate relation to bonding cannot be measured, raising a problem that bonding quality cannot be accurately monitored.

Furthermore, when a sliding state between the bonding tool and a first member positioned close thereto changes, due to deformation of that member, and where a second member to be bonded with the first member is formed on a resin material so as not to be secured thereto rigidly, causing the second member to vibrate as bonding proceeds, there arises a problem that bonding quality cannot be accurately determined by merely measuring a vibratory state of the bonding tool alone.

An object of the invention is to provide an ultrasonic bonding apparatus and a monitoring method used therein which can always achieve bonding of high quality even when a constraint condition on the bonding tool changes to change the maximum vibration position, a sliding state between the bonding tool and the first bonding member changes or a constraint state on the second bonded member (inclusive of a stationary member) is not always satisfactory.

According to the invention, an apparatus includes vibratory state detecting means for detecting, for example, vibratory states of first and second bond members under condition that measurement is effected within an area corresponding to a measuring spot diameter of several of hundreds of $\mu$m or less, the detecting means including a visible laser source. An interference fringe measuring system and an optical fiber optics is provided, with means being provided for performing a feedback control such that a bonding condition based on bonding quality determined from a result of the vibratory state detection is feedback-controlled to provide proper bonding time. A monitoring method of the present invention decides bonding quality by recognizing, for example, bonded conditions between the first and second bond members. Further, through feedback control of the bonding condition, bonding quality can be further improved.

In some types of members, a relative vibration between the first and second bond members is sometimes difficult to detect and in such a case, vibratory states of the tip portion of tool (ultrasonic wave applying means) and the first bond member or vibratory states of the tool tip portion and the second bond member may be detected to provide a relative vibration.

In performing the detection of a relative vibration, when one of the two members is fixed, detection of vibratory states of the two members is not always necessary but detection of only a vibratory state of one member which vibrates suffices.

In the ultrasonic bonding method, bonding surfaces of members to be bonded together are mated and a vibration is applied in a direction parallel to the bonding surfaces in order that microscopic friction is generated to press bond the members. Accordingly, the bonding state is closely related to a relative vibratory state between the two members in such a manner that sliding between the two members is large under a state that bonding is not completed but under a state that bonding is completed relative motion between the two is lessened by being confined within the range of plastic or elastic deformation. This demonstrates that, in principle, detecting vibrations of the respective members to be bonded together and monitoring relative displacement therebetween provide the most suitable way to diagnose bonding quality.

However, depending upon the size and shape of the members to be bonded together or the ambient conditions of production equipment, direct detection of vibrations of the members to be bonded together is sometimes difficult to achieve. A practical method to meet this situation is to detect vibrations of portions in vibratory states most approximating vibrations of the members to be bonded together in place of detecting vibrations thereof so as to perform quality monitoring.

A mechanical vibration system, as shown in FIG. 9, is comprised of a vibrator 85 including piezoelectric devices 81 and 82 and metal plates 83 and 84, a horn 86 and a bonding tool 87. Vibrator 85 and horn 86 generate longitudinal vibrations in the axial direction and they are designed such that vibratory amplitude 89 which occurs at a position of the bonding tool 87 is maximized and constant. The vibration is transmitted to the bonding tool 87 and converted thereby into a transverse vibration which, in turn, is applied to members to be bonded. The vibration of the bonding tool 87 differs for a no-load condition and a loaded condition during bonding, exhibiting a vibratory mode 90 for the no-load condition and a vibratory amplitude 91 for the loaded condition. As shown in FIG. 9, the maximum vibration position occurs at the bonding tool tip during non-loading but it is displaced to a position designated at $l_l$ during loading. Accordingly, for detection of a vibration of the bonding member or, in terms of the bonding tool, a vibration of its tip, a method of detecting the maximum amplitude lacks accuracy and another method capable of accurately specifying a measuring position is desired. Taking into consideration the fact that the protruding length of the bonding tool is typically designed to be ¼ or ⅓ of a wavelength of ultrasonic vibration and $l_f$ measured from the bonding tool tip does not exceed 1/16 wavelength, the measuring position is preferably set to at least 1/32 wavelength or less measured from the tip.

Accordingly, in the present invention, an ultrasonic wave may preferably be measured at positions corresponding to either a combination of a first bonded member, near to the bonding tool, and a second bonded member or a combination of the tip, within the range of wavelength, of bonding tool 87 and the second bonded member and, when the second bonded member can be sufficiently rigidly fixed, a desired position or positions selected from arbitrary position of a first bonding member alone, the tip of the bonding tool 87 alone, arbitrary two positions of the bonding tool 87 and two positions of the tip of the bonding tool 87 and the first bonding member may be set as measuring position or positions.

In detecting a vibration of a body by a laser beam, recent advancement in optical sensor and in electrical circuit device for processing signals has succeeded in making it possible to measure a vibration in a high frequency range of the order of 100 kHz. Furthermore, an optical system utilizing optical fibers facilitates focusing of a laser beam on a position desired to be measured and besides an optical head is significantly reduced in weight and is easy to handle. Additionally, the laser beam can be focused in principle by an optical lens to provide a spot diameter as small as the level of a wavelength of the laser beam. With an optical fiber used, the spot diameter cannot be smaller than a diameter of the optical fiber under the influence of the size effect of an outgoing beam from the fiber end surface but its value which is several times the core diameter (approximately, several of tens of $\mu m$) of the fiber, that is, about 50 $\mu m$ can be obtained easily, thus ensuring that a vibration of a minute body whose portion to be measured has a width of only several of hundreds of $\mu m$ can be accurately detected.

Therefore, according to the vibration measuring method utilizing laser, by taking advantage of the fact that a vibration at 60 kHz used in ultrasonic bonding can be detected, the weight of the optics can be reduced to 20 g or less, the optics can be mounted to a movable body by utilizing flexibility of optical fiber and the diameter to be measured can be less than 100 $\mu m$, the optics can be mounted to a movable bonding head so that the focal point may be fixed at the tip of a movable tool, and therefore a vibration of the tool having a tip diameter of approximately several hundreds of $\mu m$ can always be accurately measured.

A method for detection of vibration by utilizing the laser Doppler effect carries out measurement based on a change in intensity of laser beam due to interference between reflection laser beam from a body to be measured and reference laser beam, and hence by using a reflection beam from a second measuring body as the reference laser beam, a relative vibratory state, for example, frequency or vibratory amplitude between the two bodies can be easily detected.

On the other hand, when looking at the progress procedure of ultrasonic bonding, it will be seen that in the initial phase of bonding, soils such as oxide films and fats and oils exist at the contact interface between first and second members to be bonded together and the two members are apt to slide, that is, placed in a condition of low frictional resistance and moved relative to each other by a large amount. When the procedure proceeds to the intermediate phase, oxide films and fats and oils are removed from the interface to establish such a state that clean metal surfaces partly come in contact with each other and so a metallic adhesion phenomenon in a solid state prevails to increase frictional resistance, resulting in the amount of relative motion between the two, that is, displacement can be gradually decreased. In the final phase of bonding, most of the bonding interfaces are metallically adhered to each other, so that the two members are joined and little displacement occurs. On the other hand, due to unevenness formed in the bonding tool, generally very little sliding occurs between the bonding tool and the first member adjacent thereto. Accordingly, on condition that the second member, inclusive of a stationary member, is fixed to a jig so as to be perfectly prevented from vibrating, progress conditions of bonding can be monitored by observing a change in vibration of the bonding tool. If, depending on material and shape of the members, sliding occurs between the bonding tool and first member, progress conditions of bonding can be monitored by observing a change in vibration of the first member. Furthermore, if the second member cannot be rigidly fixed, bonding conditions can be monitored by detecting vibrations of either bonding tool or first member and the second member and comparing detected vibrations of the two. In this case, since degradation of a bonding ambience condition can be determined from the vibration of the second member, this mode is also effective to monitor control of a bonding condition.

As described above, in the vibration measurement monitoring utilizing the Doppler effect of laser, bonding quality can be accurately diagnosed by adjusting the detection site in compliance with a bonding ambience condition. However, the above method is not always relied upon and the object of the invention can be attained by detecting a relative vibratory state between the two bonding members to be bonded together by an ultrasonic wave.

Further, by performing proper feedback control of a bonding condition on line on the basis of a result of diagnosis of bonding conditions in mid course of bonding, bonding of stable bonding quality can be accomplished to permit bonding quality control.

DESCRIPTION OF THE PREFERRED EMBODIMENTS

Figure 1:
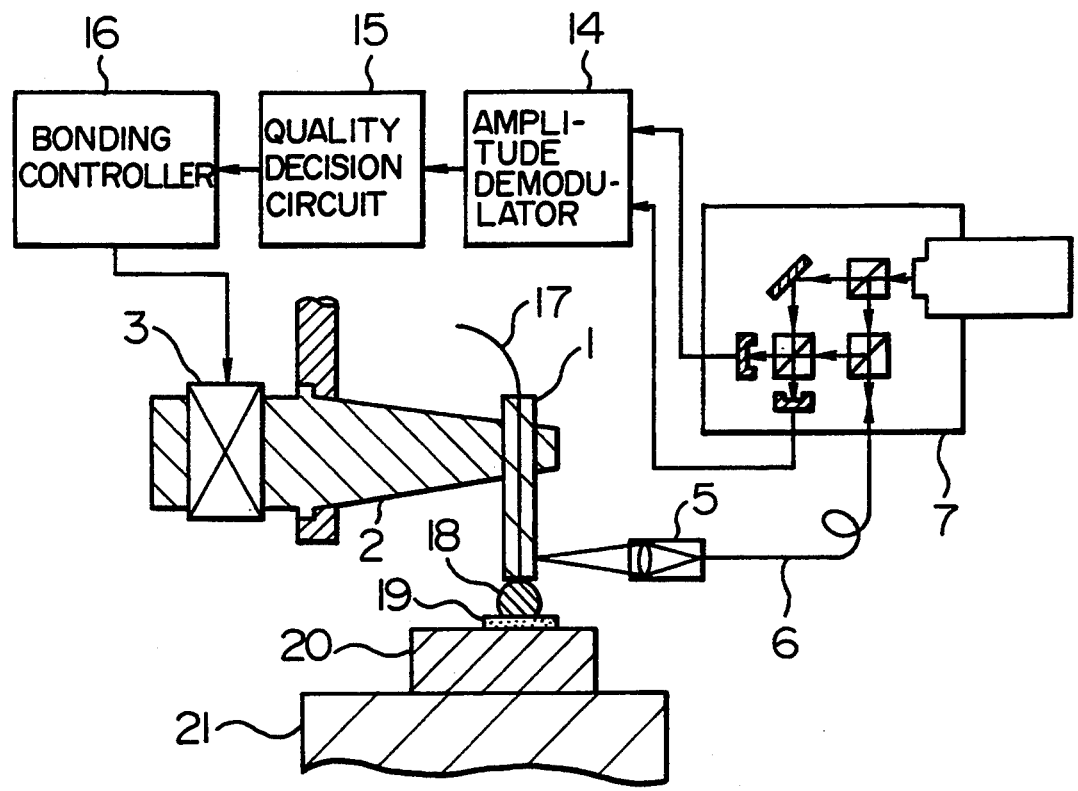
FIG. 1 is a schematic view of an embodiment of an ultrasonic bonding apparatus according to the present invention.

Embodiments of the present invention will now be described with reference to the accompanying drawings; however, the invention is in no way limited to embodiments described hereinafter and the contents described in the drawings wherein life reference numerals are used throughout the various views to designate like parts.

FIG. 1 shows an example of an ultrasonic bonding apparatus of the invention which can detect an ultrasonic vibration of the tip of a bonding tool (ultrasonic wave applying means) and control a bonding condition properly on the basis of a change in ultrasonic vibration with time. In FIG. 1, a vibrator 3 is driven by an electric signal generated from a bonding controller 16 including an ultrasonic wave power supply, a transmitted electric signal is amplified by a horn 2 connected to the vibrator 3, and an ultrasonic vibration is applied from a tool 1 to a first workpiece 19 (active bonding member or simply referred to as bonding member). A metal ball 18 standing for the first workpiece and attached to the tip of a wire 17 is pressed on a second 19 (passive bonded member or simply referred to as bonded member) carried on a stationary member 20 so as to be bonded to the second workpiece under the influence of the ultrasonic vibration. The stationary member 20 is fixed to a jig 21. A vibratory state of the tool tip during bonding is converted into an electric signal by a measuring system comprised of a laser Doppler vibrometer 7, an optical fiber 6 and a laser beam condenser head 5, and the electric signal is then converted by an amplitude demodulator 14 into vibration information which, in turn, is transmitted to a quality decision circuit 15. Responsive to the transmitted vibration information, the quality decision circuit 15 diagnoses a bonding progress state to determine bonding end time or an optimum ultrasonic output at the bonding end time. Delivery of the ultrasonic output is stopped or adjustment of the ultrasonic output to a proper value is effected in dependence upon a command from the quality decision circuit 15.

Figure 2:
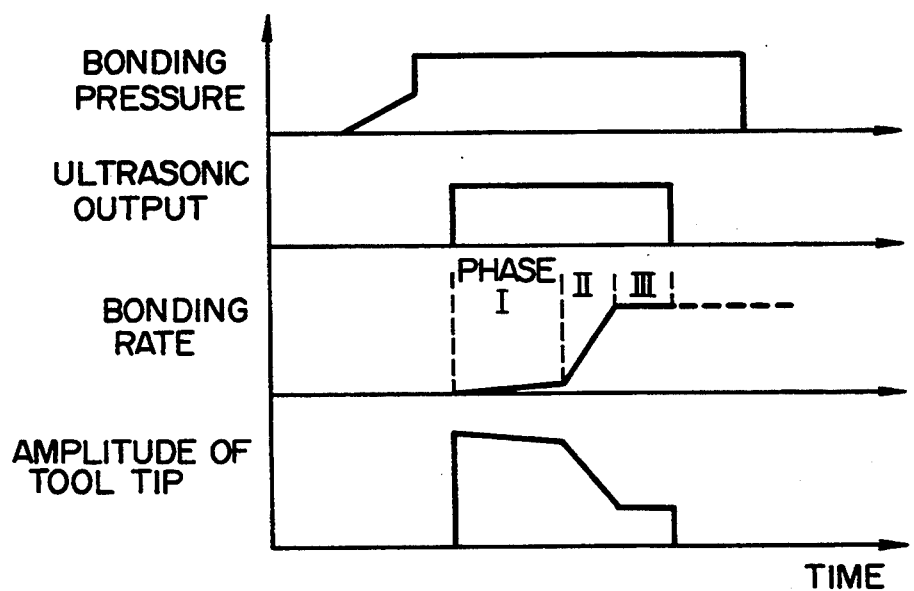
FIG. 2 is a time chart illustrating a sequence of bonding time control in the apparatus of FIG. 1.

As shown in the time chart of FIG. 2, bonding is carried out by first lowering the bonding tool to apply a bonding pressure to the workpieces and then applying an ultrasonic vibration to the tool. In a phase I of bonding, interfacial sliding takes place between the two workpieces to exclude oxide films and soils to the outside, thus permitting cohesive adhesion to proceed and as a result the bonding rate increases abruptly in phase II. As the bonding rate increases, constraints on the tool increase and the amplitude of vibration of the tool tip decreases. Subsequently, as the bonding rate becomes saturated in a phase III, the decreasing change in amplitude becomes smaller. A reduction of the decreasing change in amplitude is then detected by a measuring instrument utilizing laser and bonding is ended. On the other hand, ultrasonic output control may be effected by adjusting the ultrasonic output such that the amplitude of the tool tip traces the procedure shown in FIG. 2 and then bonding proceeds for a predetermined time.

According to the invention, since a vibration of the tool during bonding is directly detected by utilizing the laser Doppler phenomenon, a change in vibration of the tool tip having the direct influence upon bonding can be measured accurately and bonding quality can be monitored accurately. Furthermore, monitoring is carried out on line and a monitoring result is fed back to a bonding condition, so that even when bonding workpieces have irregular surfaces and different soiled states and different oxidized states make proper bonding conditions different, bonding of uniform bonding quality can be accomplished.

In addition, since, according to the present invention, whether or not a tool mount state is proper after a tool exchange can be evaluated easily and quantitatively by measuring a tool vibration under no load condition, time for adjustment work upon a tool exchange can be reduced and occurrence of defective bonding due to defective tool mount can be prevented, permitting drastic improvements on productivity. Also, expertise is not needed for tool mounting adjustment and so persons serviceable for adjustment work can be maintained easily.

Figure 3:
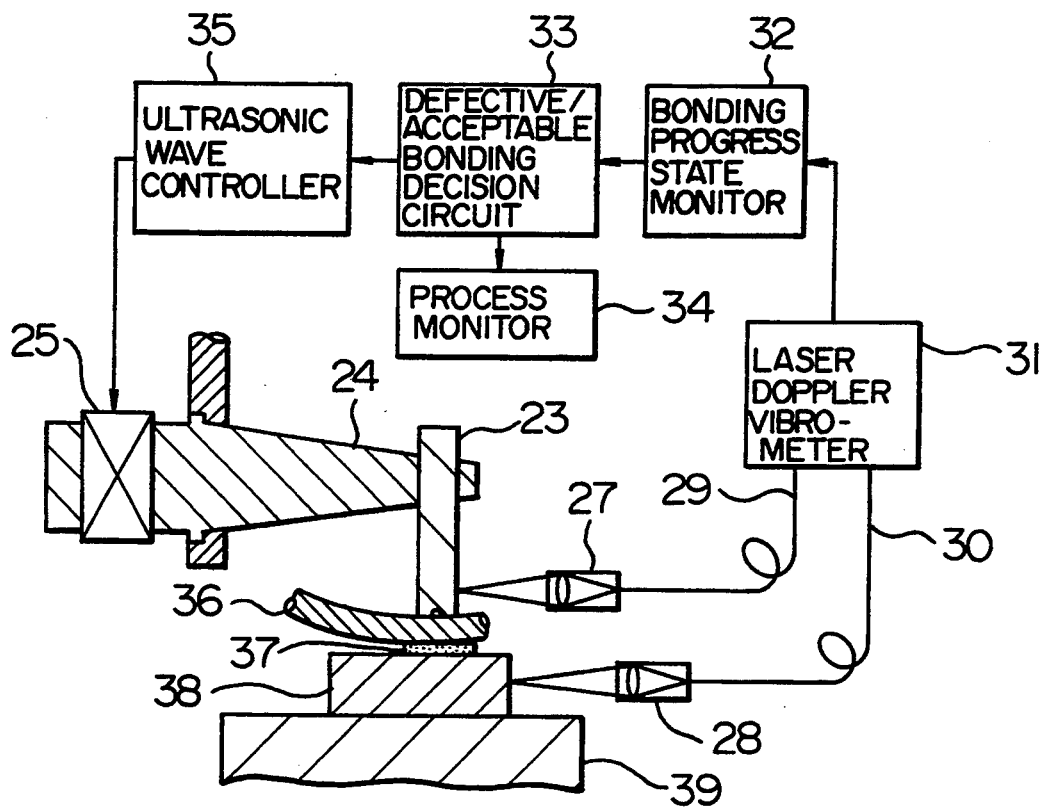
FIG. 3 is a partially schematic cross-sectional view of an embodiment of a system of an ultrasonic bonding apparatus constructed in accordance with the present invention.

In FIG. 3, a vibrator 25 is driven by an electric signal generated from an ultrasonic wave controller 35, a transmitted electric signal is amplified in amplitude by a horn 24, and an ultrasonic vibration is applied from a tool 23 to a first workpiece (bonding member) 36. The first workpiece is pressed on a second workpiece (bonded member) 37 carried on a stationary member 38 fixed to a jig 39 so as to be bonded to the second workpiece under the influence of the ultrasonic vibration. Vibratory states of the tool tip and stationary member at that time are detected by a vibration measuring system comprised of a laser Doppler vibrometer 31, optical fibers 29 and 30, and laser beam condenser heads 27 and 28. On the basis of a change with time in relative vibratory amplitude between the two vibratory states, a bonding progress state monitor 32 diagnoses bonding end time. A resulting bonding end signal is transmitted to the ultrasonic controller 35 through a defective/acceptable bonding decision circuit 33 to stop oscillation of the electric signal generated from the ultrasonic controller 35, ending the bonding. The defective/acceptable bonding decision circuit 33 checks whether the bonding time is below a predetermined time and it determines that the bonding is acceptable if the bonding time is below the predetermined time but informs a process monitor 34 of defective bonding if the bonding time exceeds the predetermined time, causing the monitor to raise the alarm.

Figure 4:
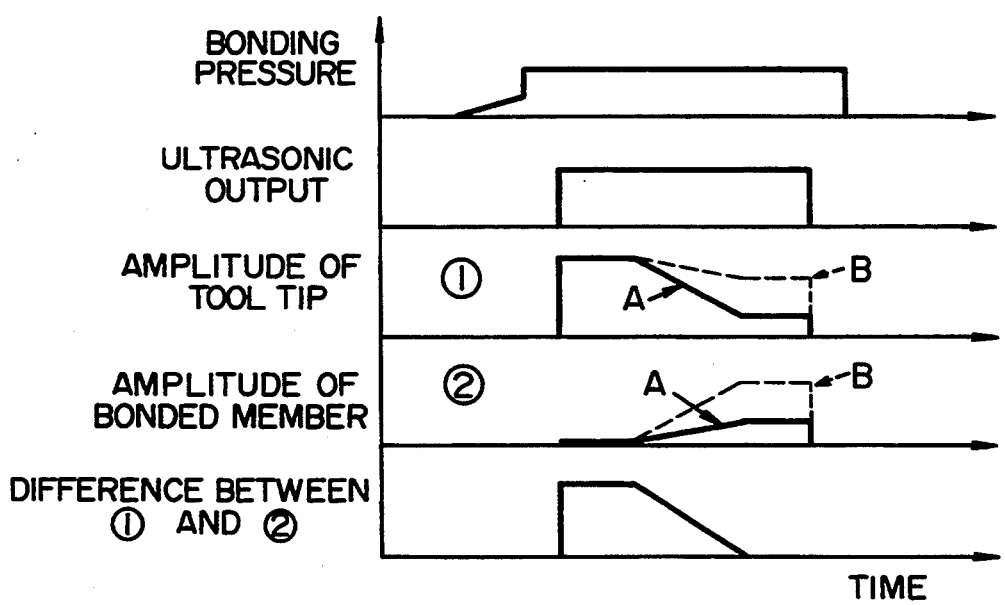
FIG. 4 is a time chart illustrating a sequence of bonding time control in the system of FIG. 3.

As shown in FIG. 4 vibratory amplitude ①  of the tool tip is initially large upon application of ultrasonic wave and, as the bonding proceeds, the amplitude decreases gradually to end in a small amplitude which is substantially constant when bonding of a constant level is achieved. On the other hand, the vibratory amplitude ② of the second workpiece standing for corresponding to a bonded member, initially approximates nearly zero but, as bonding proceeds, the vibratory amplitude increases gradually to finally end in substantially the same vibration as that of the tool tip. The final vibratory amplitude differs depending on the degree of fixing of the stationary member. If the fixing is rigid, then the amplitude will be small, represented by the solid line A but if the fixing is loose, the amplitude will be large as represented by the dashed dotted line B. In either case, however, the final vibratory amplitude of the tool substantially equals that of the bonded workpiece. Accordingly, in either case, a relative vibratory amplitude, that is, the difference between ① and ② is initially large and becomes almost zero or a low value in the phase of completion of bonding. Therefore, by setting the bonding end time to a time point that the relative vibratory amplitude has decreased by a predetermined percentage relative to an initial value or to a time point amounting to time equal to ultrasonic wave application time which has elapsed until the former time point occurs and which is multiplied by a certain ratio, bonding of stable bonding quality can be accomplished.

Since according to the present invention the laser beam can be focused to a diameter of 100 $\mu$m or less by the beam condenser head having a lens system and vibrations of minute parts can be accurately measured, a change in vibratory state of the minute bonding tool having of a width of several of hundreds of micron meters and vibrating with an amplitude of approximately several of micron meters at a frequency of several of tens or several of hundreds of kHz and a change in vibratory state of the bonded member having a thickness of 0.1 to several of millimeters can be detected accurately and bonded conditions can be monitored on line.

Further, according to the method using a relative vibration between the bonding tool 23 and second workpiece 37 or between the bonding tool 23 and stationary member 38 for the purpose of deciding bonded conditions, even when intervening media or organic insulating films such as oxide films and soils which disturb bonding are present at bonding surfaces or even when unsteady fixing of the stationary member changes the proper bonding condition, the bonding time can be adjusted automatically to a proper value to ensure that occurrence of defective bonding can always be prevented and yield of bonding process can be improved, though there is a constraint condition that sliding between the bonding tool and first workpiece 36 should be small.

Figure 5:
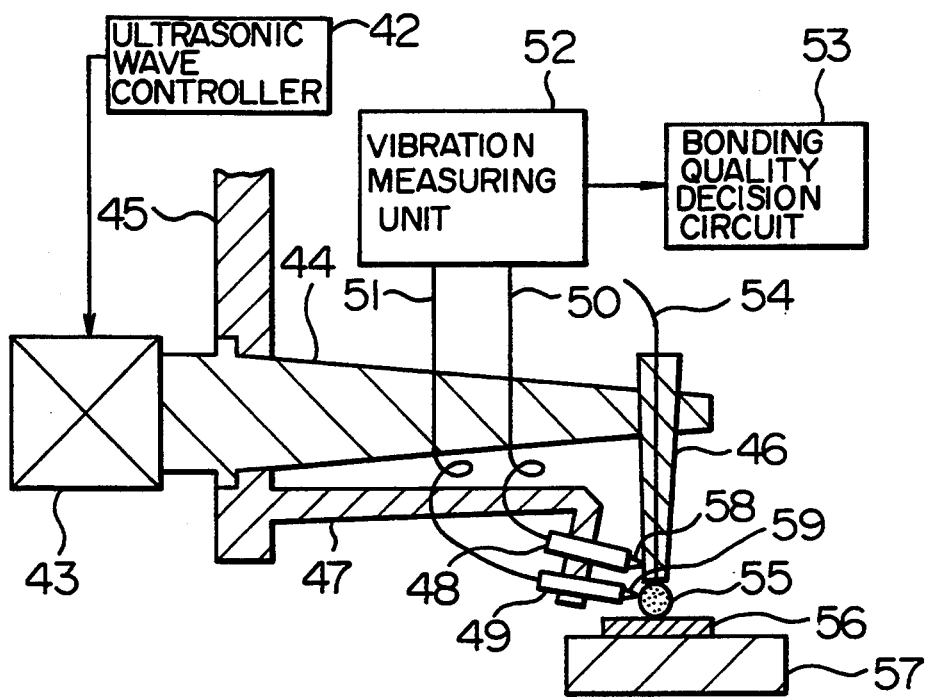
FIG. 5 is a partially schematic cross-sectional view of another embodiment of an ultrasonic bonding apparatus including laser beam condenser heads fixed to a tool moving carriage in accordance with the present invention.

In FIG. 5, a vibrator 43, a horn 44 and a tool 46 are coupled together mechanically rigidly and are integral with a support jig 45 so as to be movable together therewith. Laser beam condenser heads 48 and 49 are fixedly held by a head fixing jig 47 mounted to the support jig, in such a manner that laser beams are focused on the tip of the tool 46 and a metal ball 55. A vibration measuring unit 52 responds to information about vibrations of the tool tip and metal ball detected by the laser beam condenser heads 48 and 49 to detect a relative vibratory amplitude between them. A bonding quality decision circuit 53 determines whether the relative amplitude exceeds a predetermined percentage relative to a value at the starting time point of bonding to provide an indication as to defective/acceptable bonding and, at the same time, raise the alarm in the event of defective bonding. As shown in FIG. 5 an ultrasonic wave control unit 42, optical fibers 50, 51 a bonding wire 54, a bonding terminal 56, a Si-chip 57 and laser lights 58, 59 are provided.

According to the invention, the laser beam condenser heads are integral with the bonding tool so as to be movable together with the bonding tool; therefore, even in high-speed wire bonding such as used in the field of semiconductor production, information about vibrations of the same (unchanged) vibration detection points can be fetched without-resort to any special drive mechanism and consequently bonding quality can be evaluated and determined accurately.

Figure 6:
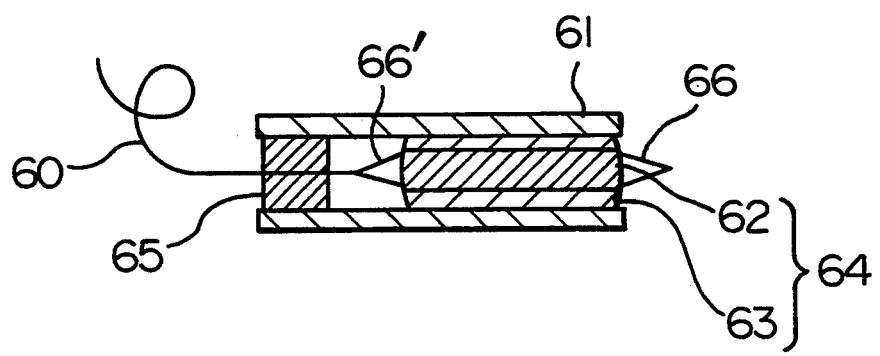
FIG. 6 is a cross-sectional view of an embodiment of a laser beam condenser head.

In FIG. 6, a rod lens 64, having a core 62 with a continuously changing refractive index continuously from center to opposite ends and a clad 63 made of the same material as that of the core and having a reflectance lower than that of the core 62 are used for laser beam focusing. The opposite ends of the rod lens are worked convexly. Furthermore, an optical fiber 60 for single mode is so fixed by a jig 65 so as to be aligned with the center axis of the rod lens 64. Reference numerals 66 and 66' denote laser lights.

Since according to the invention the beam condenser head can be easily constructed by using the rod lens of about 1 mm diameter, the head can be reduced in size and weight as a whole to minimize the influence the beam condenser head carried on a bonding head has upon driving system and vibration system of the bonding head, making it possible to apply the monitoring system of the present invention to existing bonding equipments. Furthermore, the beam condenser head takes the form of a needle of about 2 mm diameter, permitting an easy mount of the condenser head to the bonding head and easy positioning of vibration detection point.

Figure 7:
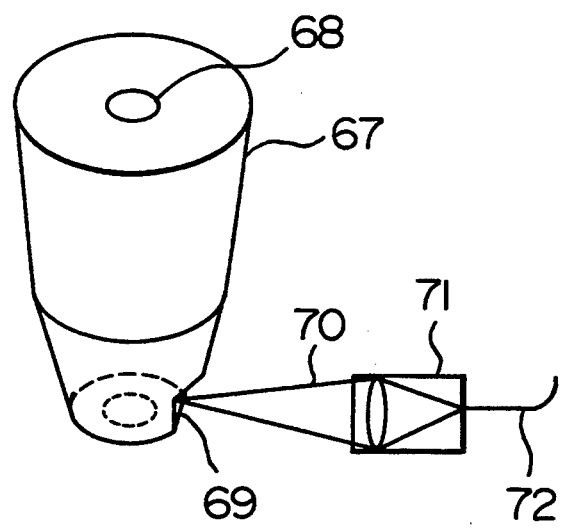
FIG. 7 is a schematic perspective view of an embodiment of a bonding capillary tool structure utilizing the doppler effect for ultrasonic vibration measurement.

As shown in FIG. 7, on the peripheral surface of the tip of a capillary tool 67 for wire bonder, is disposed a vibration measuring surface 69 which is flattened and smoothed so as to exhibit a high reflecting power for a laser. A laser light 70 guided by an optical fiber 72 is focused onto the vibration measuring surface by a light condensing head 71. A through hole 68 enables an insertion of the bonding wire.

According to the invention, since laser intensity of reflection wave can be raised, a change in intensity of laser beam due to the Doppler phenomenon can be detected even when the output of the laser oscillator for vibration detection is decreased and hence the life of the laser oscillator can be extended to facilitate maintenance.

Figure 8:
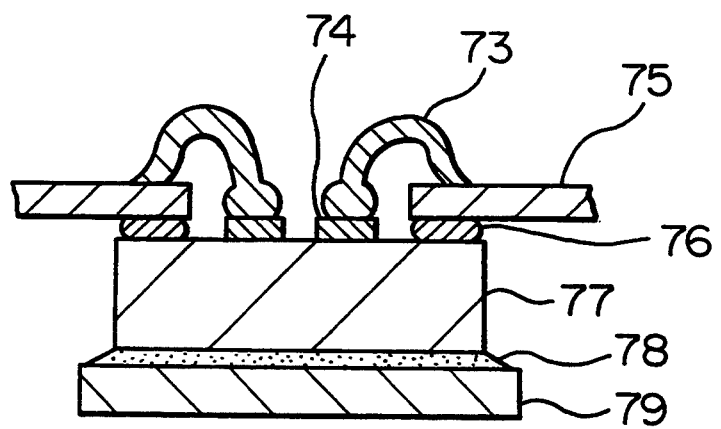
FIG. 8 is a cross-sectional view of an semiconductor packaging device.
Figure 9:
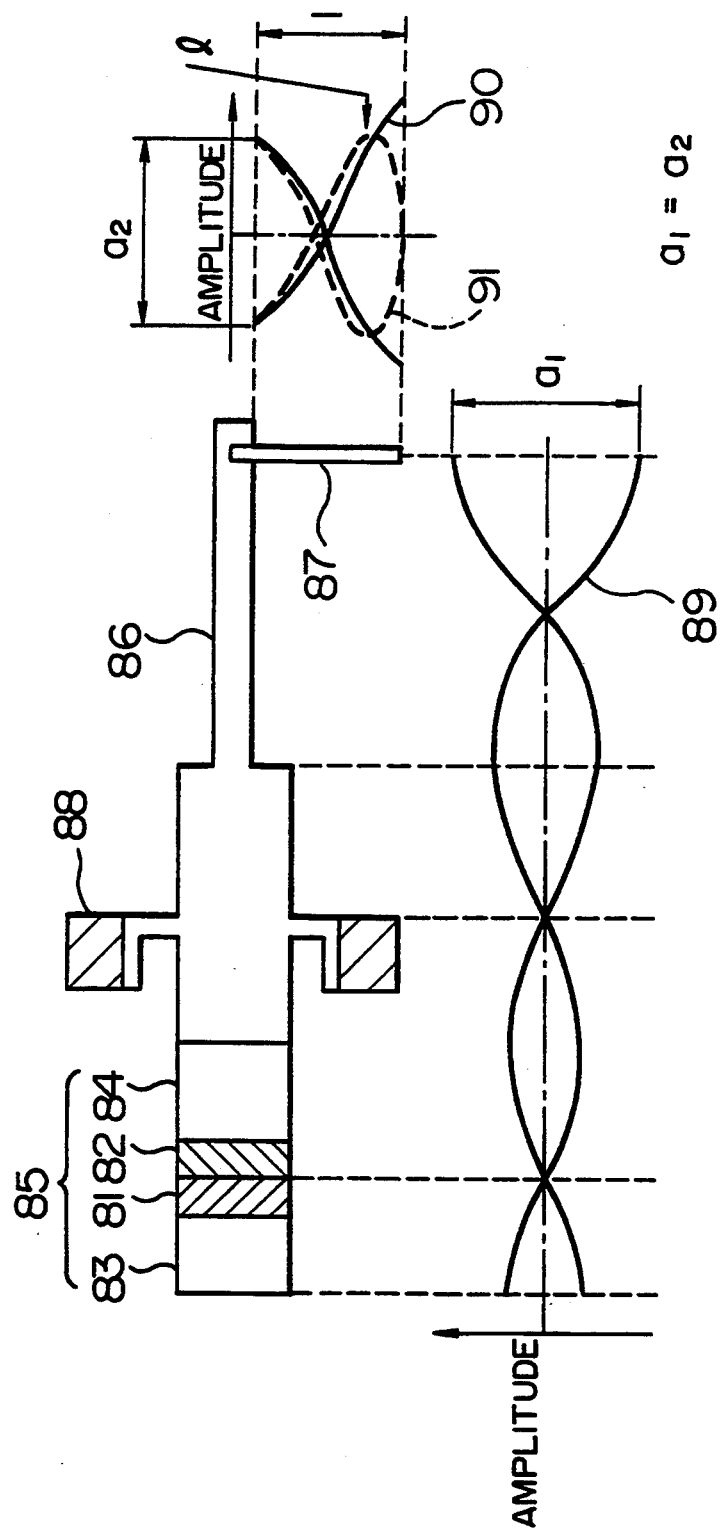
FIG. 9 is a partically schematic cross-sectional view of a vibration mode of a mechanical cross-sectional view of a vibration mode of a mechanical vibration system of an ultrasonic bonding apparatus.

In FIG. 8, a Si chip 77 is secured onto a die pad 79 with a bonding agent 78. Metal leads 75 are secured onto the chip with damper bonding agents and a wire 73 is bonded to a terminal 74 and a metal lead 75 on the chip to interconnect them together. With the prior art bonding apparatus, when a wire is bonded to a metal lead secured insufficiently rigidly onto a damper, defective bonding is liable to occur and the semiconductor packaging structure as shown in the FIG. 8 embodiment cannot be realized on mass production level. According to the present invention, even if rigidity of fixing of a metal lead is insufficient, satisfactory bonding can always be accomplished steadily by monitoring vibratory states of the lead and tool and feeding a monitoring result back to a bonding condition so as to realize the semiconductor packaging structure shown in FIG. 8.

According to the present embodiment, even with a large-sized chip, the amount of distortion due to the difference in thermal expansion between mold resin and Si chip can be reduced by collectively arranging terminals at the center of the chip, so that fatigue rupture concomitant with heat cycle applied to a bonding part can be prevented and reliability can be promoted. By virtue of the structure in which the lead is secured to the chip through dampers, relative displacement between the lead and chip can be limited without causing forcible stress in the chip and as a result the distance between the terminal and lead can be reduced to lower the height of wire loop and the thickness of the semiconductor package can be reduced even in the wire bonding type structure.

As described in detail above, according to the invention, the ultrasonic bonding apparatus and the quality monitoring method can be provided which can constantly maintain high bonding quality even when a constraint condition on the bonding tool changes to change the maximum vibration position, the sliding state between the bonding tool and upper first bonding member changes or a constraint condition on the lower second bonded member is not always satisfactory.

We claim:

1. An ultrasonic bonding apparatus comprising:
    ultrasonic wave generating means;
    means for applying an ultrasonic wave generated from said ultrasonic wave generating means to a bonding member;
    a jig for holding a stationary member to which a member to be bonded with said bonding member is secured;
    means for detecting a relative vibratory state between said bonding member and said member to be bonded;
    means for diagnosing a result of said detection; and
    means for feeding a result of said diagnosis back to said ultrasonic wave generating means, and
    wherein a detector utilizing a laser Doppler effect is used as said detecting means.

2. A quality monitoring method for monitoring quality of a state of bonding effected by an ultrasonic bonding method of bonding a bonding member and a bonded member by applying an ultrasonic wave to said bonding member, the method comprising the steps of:
    detecting a relative vibratory state between said bonding member and said bonded member;
    diagnosing a result of said detection; and
    feeding a result of said diagnosis back to said means for generating said ultrasonic wave,
    wherein said detecting step uses a detector utilizing a laser Doppler effect.

3. A quality monitoring method for monitoring a quality of a state of bonding effected by an ultrasonic bonding method of bonding a bonding member and a bonded member by applying an ultrasonic wave to said bonding member, the method comprising the steps of:
    detecting a relative vibratory state between said bonding member and said bonded member;
    diagnosing a result of said detection; and
    feeding a result of said diagnosis back to means for generating said ultrasonic wave,
    wherein said diagnosing step diagnosis a bonding state on a basis of an amount by which the amplitude or rate of a detected ultrasonic vibration decreases in comparison with that occurring upon a starting of application of the ultrasonic wave.

4. An ultrasonic bonding apparatus comprising:
    ultrasonic wave generating means;
    means for applying an ultrasonic wave generated from said ultrasonic wave generating means to a bonding member;
    a jig for holding a stationary member to which a member to be bonded with said bonding member is secured said stationary member being fixedly secured to said jig;
    means for detecting a vibratory state of said member to be bonded;
    means for diagnosing a result of said detection; and
    means for feeding a result of said diagnosis back to said ultrasonic wave generating means,
    wherein a detector utilizing a laser Doppler effect is used as said detecting means.

5. An ultrasonic bonding apparatus comprising:
    ultrasonic wave generating means;
    means for applying an ultrasonic wave generated from said ultrasonic wave generating means to a bonding member;
    a jig for holding a stationary member to which a member to be bonded with said bonding member is secured;
    means for detecting a vibratory state between said ultrasonic wave applying means and said member to be bonded;
    means for diagnosing a result of said detection; and
    means for feeding a result of said diagnosis back to said ultrasonic wave generating means,
    wherein a detector utilizing a laser Doppler effect is used as said detecting means.

6. An ultrasonic bonding apparatus comprising:
    ultrasonic wave generating means;
    means for applying an ultrasonic wave generated from said ultrasonic wave generating means to a bonding member;
    a jig for holding a stationary member to which a member to be bonded with said bonding member is secured, said stationary member being fixedly secured to said jig;
    means for detecting a vibratory state of said ultrasonic wave applying means;
    means for diagnosing a result of said detection; and
    means for feeding a result of said diagnosis back to said ultrasonic wave generating means, and
    wherein a detector utilizing a laser Doppler effect is used as said detecting means.

7. A quality monitoring method for monitoring a quality of a state of bonding effected by an ultrasonic bonding method of bonding a bonding member and a bonded member which is secured to a jig through a stationary member by applying an ultrasonic wave to said bonding member, the method comprising the steps of:
    detecting a vibratory state of said bonding member;
    diagnosing a result of said detection; and
    feeding a result of said diagnosis back to means for generating said ultrasonic wave,
    wherein said detecting step uses a detector utilizing a laser Doppler effect.

8. A quality monitoring method for monitoring a quality of a state of bonding effected by an ultrasonic bonding method of bonding a bonding member and a bonded member which is secured to a jig through a stationary member by applying an ultrasonic wave to said bonding member, the method comprising the steps of:
    detecting a vibratory state of said bonding member;
    diagnosing a result of said detection; and
    feeding a result of said diagnosis back to means for generating said ultrasonic wave,
    wherein said diagnosing step diagnoses a bonding step on a basis of an amount by which an amplitude or rate of a detected ultrasonic vibration decreases in comparison with that occurring upon a starting of application of the ultrasonic wave.

9. A quality monitoring method for monitoring a quality of a state of bonding effected by an ultrasonic bonding method of bonding a bonding member and a bonded member by applying an ultrasonic wave to said bonding member, the method comprising the steps of:

detecting a relative vibratory state between means for applying said ultrasonic wave and said bonded member;

diagnosing a result of said detection; and feeding a result of said diagnosis back to said ultrasonic wave generating means, wherein said detecting step uses a detector utilizing a laser Doppler effect.

10. A quality monitoring method for monitoring a quality of a state of bonding effected by an ultrasonic bonding method of bonding a bonding member and a bonded member by applying an ultrasonic wave to said bonding member, the method comprising the steps of:

detecting a relative vibratory state between means for applying said ultrasonic wave and said bonded member;

diagnosing a result of said detection; and feeding a result of said diagnosis back to said ultrasonic wave generating means, wherein said diagnosing step diagnoses a bonding step on a basis of an amount by which an amplitude or rate of a detected ultrasonic vibration decreases in comparison with that occurring upon a starting of application of the ultrasonic wave.

11. A quality monitoring method for monitoring quality of ultrasonic bonding effected by an ultrasonic bonding method of bonding a bonding member in a bonded member which is secured to a jig through a stationary member by applying an ultrasonic wave to said bonding member, comprising the steps of:

detecting a vibratory state of means for applying said ultrasonic waves;

diagnosing a result of said detection; and feeding a result of said diagnosis back to said ultrasonic wave generating means, add wherein said detecting step uses a detector utilizing a laser Doppler effect.

12. A quality monitoring method for monitoring quality of ultrasonic bonding according to claim 11, wherein said diagnosing step diagnoses a bonding state on the basis of an amount by which the amplitude or rate of a detected ultrasonic vibration decreases in comparison with that occurring upon starting of application of the ultrasonic wave.

* * * * *